United States Patent
Ma et al.

(10) Patent No.: US 10,768,413 B2
(45) Date of Patent: Sep. 8, 2020

(54) FLARE- AND GHOST-FREE IMAGING DEVICE

(71) Applicant: TRIPLE WIN TECHNOLOGY(SHENZHEN) CO.LTD., Shenzhen (CN)

(72) Inventors: Xiao-Mei Ma, Guangdong (CN); Shin-Wen Chen, New Taipei (TW); Long-Fei Zhang, Guangdong (CN); Kun Li, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 18 days.

(21) Appl. No.: 16/220,307

(22) Filed: Dec. 14, 2018

(65) Prior Publication Data
US 2020/0018949 A1   Jan. 16, 2020

(30) Foreign Application Priority Data
Jul. 12, 2018 (CN) .................. 2018 2 1101998 U

(51) Int. Cl.
*G02B 27/00* (2006.01)
*H04N 5/225* (2006.01)
*H01L 27/146* (2006.01)
*H05K 1/18* (2006.01)
*H05K 1/02* (2006.01)
*H05K 1/14* (2006.01)

(52) U.S. Cl.
CPC .... *G02B 27/0018* (2013.01); *H01L 27/14621* (2013.01); *H04N 5/2253* (2013.01); *H04N 5/2254* (2013.01); *H05K 1/0201* (2013.01); *H05K 1/14* (2013.01); *H05K 1/181* (2013.01); *H05K 2201/10121* (2013.01); *H05K 2201/10151* (2013.01)

(58) Field of Classification Search
CPC .... G02B 27/0018; H05K 1/14; H05K 1/0201; H04N 5/2254; H01L 27/14618; H01L 27/14625
See application file for complete search history.

(56) References Cited

U.S. PATENT DOCUMENTS

| | | | | |
|---|---|---|---|---|
| 2004/0109079 A1* | 6/2004 | Fujimoto | ............. | H04N 5/2254 348/340 |
| 2008/0316623 A1* | 12/2008 | Aoki | ........................ | G02B 7/04 359/823 |
| 2013/0148016 A1* | 6/2013 | Oh | ........................ | H04N 5/2253 348/374 |
| 2015/0077840 A1* | 3/2015 | Kim | ........................ | G02B 7/08 359/355 |

\* cited by examiner

*Primary Examiner* — Ahmed A Berhan
(74) *Attorney, Agent, or Firm* — ScienBiziP, P.C.

(57) ABSTRACT

A camera device proofed against ghosting and light flare includes a printed circuit board, an image sensor mounted on the printed circuit board, a supporting bracket fixed on the printed circuit board, and a lens module. The supporting bracket includes supporting plate and perpendicular side wall, the supporting plate and the side wall together forming a receiving room over the image sensor. The supporting plate has a central through hole for light ingress and a flange barrier protruding. The protruding flange barrier surrounds the light through hole, the lens module is fixed on the supporting surface, and the protruding flange barrier locates inside an inner side surface of the lens module.

13 Claims, 4 Drawing Sheets

FLARE- AND GHOST-FREE IMAGING DEVICE

FIELD

The subject matter herein generally relates to imaging devices.

BACKGROUND

Camera modules in electronic devices, such as digital cameras and mobile phones, usually include a lens barrel and a lens module fixed on the lens barrel. During image capture by the camera module, a portion of light from the viewed object incident on the lens module can be reflected by the lens barrel, and reach the image sensor of the camera module, thus forming a ghost or flare and degrading the quality of the image.

Therefore, there is room for improvement within the art.

BRIEF DESCRIPTION OF THE DRAWINGS

Implementations of the present technology will now be described, by way of embodiments only, with reference to the attached figures.

DETAILED DESCRIPTION

Figure 1:
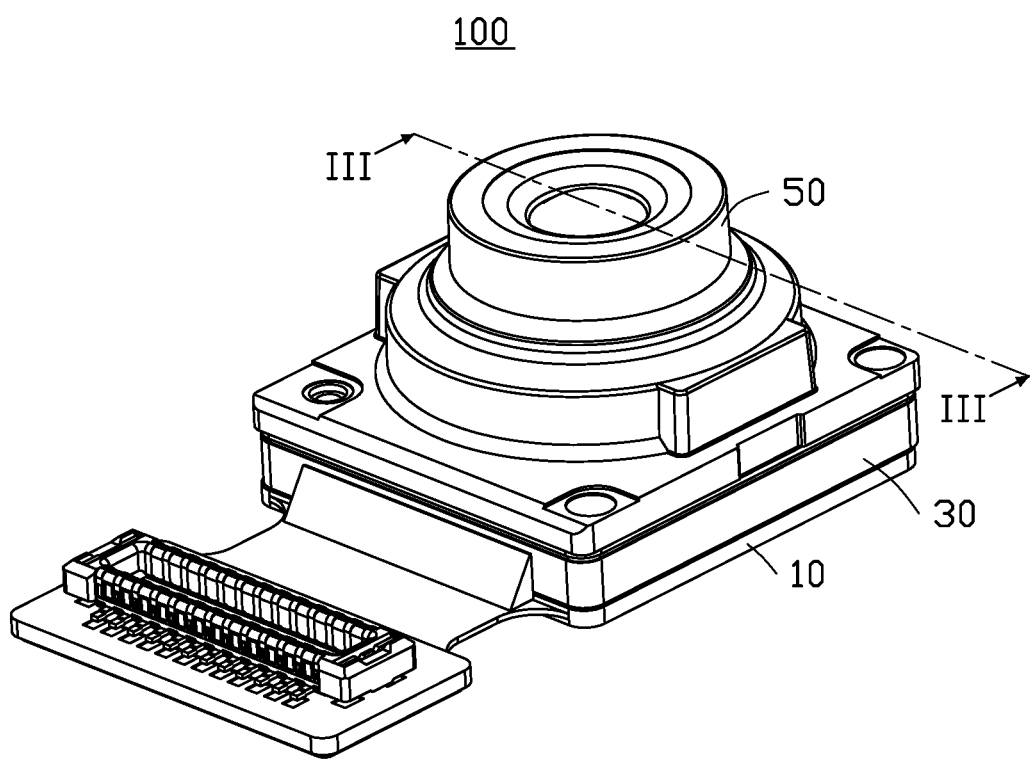
FIG. 1 is an isometric view of a camera device in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIGS. 1-4 illustrate a camera device 100 according to one embodiment. The camera device 100 includes a printed circuit board 10, an image sensor 20, a supporting bracket 30, a protecting sheet 40, and a lens module 50.

The printed circuit board 10 can be a flexible circuit board, a ceramic board, or a rigid-flexible board. In the illustrated embodiment, the printed circuit board 10 is a rigid-flexible board.

The printed circuit board 10 includes a first portion 11 and a second portion 12 connected with the first portion 11. The first portion 11 is provided with circuit components 13, the second portion 12 is provided with a connector 14. In this embodiment, the circuit components 13 are mounted on an edge area of the printed circuit board 10. The circuit components 13 are electrically connected to the image sensor 20. The circuit components 13 may be, but are not limited to, resistors, capacitors, diodes, transistors, potentiometers, relays, and drivers, etc. The connector 14 is electrically connected to the image sensor 20 for signal transmission between the image sensor 20 and an electronic device.

The image sensor 20 is mounted on a central area of the first portion 11 of the printed circuit board 10 and electrically connected to the printed circuit board 10 via wires 25. Material of wires 25 may be selected from, but is not limited to, gold, copper, aluminium, silver, etc. In particular, the wires 25 should be arced or bent, thereby avoiding bending damage to the wires 25.

The supporting bracket 30 is fixed on the first portion 11 via a first adhesive 101. The first adhesive 101 includes a first adhesive portion 102 and a second adhesive portion 103. The first adhesive portion 102 is applied on one circle of the printed circuit board 10 and configured to fix a bottom of the supporting bracket 30. The second adhesive portion 103 is applied on the second portion 12 of the printed circuit board 10 and configured to fix one side surface of the supporting bracket 30, to prevent the supporting bracket 30 dropping from the printed circuit board 10.

The supporting bracket 30 is substantially a square frame and includes a supporting plate 32 and a side wall 34 perpendicular to the supporting plate 32. The supporting plate 32 and the side wall 34 together form a receiving room 305 which covers the image sensor 20.

The supporting plate 32 is opened to form a step portion 330 and a light through hole 332 for passage of light. The step portion 330 includes a top bearing surface 334, the top bearing surface 334 includes a plurality of micro-structures 336. The micro-structures 336 can be formed on the top bearing surface 334 by etching a mold with laser or an etching liquid, and the matte surface resulting is impressed on the injection-molded supporting bracket 30 by the mold. The supporting bracket 30 with the micro-structures 336 on the top bearing surface 334 is thus obtained.

The supporting plate 32 includes a supporting surface 320 for supporting the lens module 50. The supporting bracket 30 includes a flange barrier 36 protruding from the supporting surface 320, the flange barrier 36 surrounds the light through hole 322.

The supporting bracket 30 further includes a first positioning portion 322 protruding from the supporting surface 320. The first positioning portion 322 includes four bumps, the first positioning portion 322 is formed at corners of the flange barrier 36. A height of the first positioning portion 322 is greater than a height of the flange barrier 36 thereby avoiding the lens module 50 being too close to the protecting sheet 40 and interfering with a protecting sheet 40.

The supporting surface 320 defines a bonding area 38 surrounding the flange barrier 36. The bonding area 38 also comprises a plurality of micro-structures 381, and a layer of adhesive 105 is formed on the micro-structures 381. The layer of adhesive 105 holds the lens module 50 in place.

Figure 2:
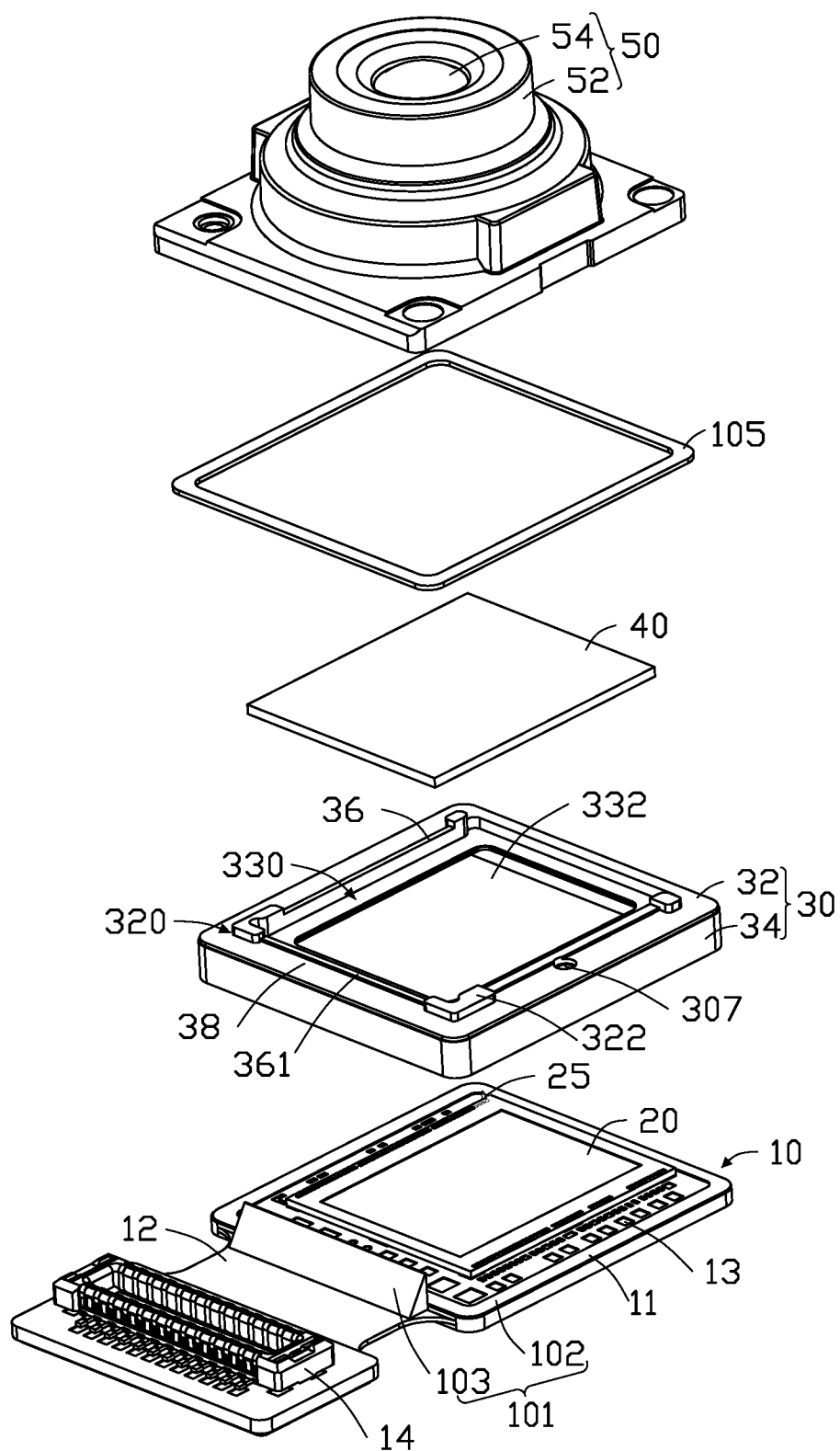
FIG. 2 is an exploded view of the camera device in FIG. 1.
Figure 3:
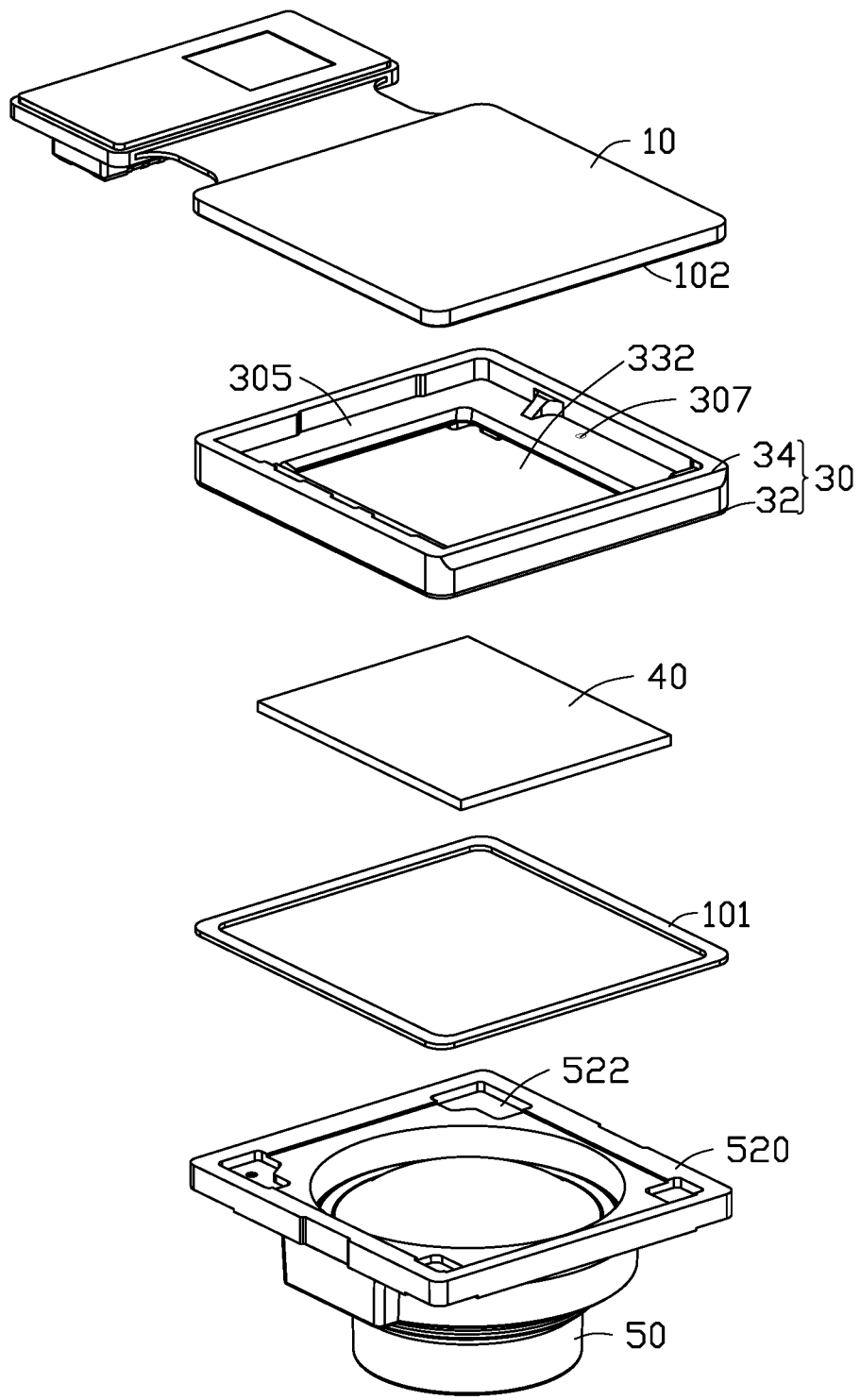
FIG. 3 is another exploded view of the camera device in FIG. 1.

The supporting bracket 30 includes a heat dissipating hole 307 at the periphery of the supporting plate 32, as shown in FIG. 2 and FIG. 3. The heat dissipating hole 307 communicates with the receiving room 305 and dissipates heat generated by the circuit components 13 and the image sensor 20 thereby preventing heat from accumulating.

The protecting sheet 40 is fixed on the top bearing surface 334 of the supporting bracket 30 via a second adhesive 339. In the shown embodiment, the protecting sheet 40 also functions as an infrared cut-off filter to filter out infrared light. The protecting sheet 40 may also be a color filter. The protecting sheet 40 protects the image sensor 20, and avoids dust and small fragments contaminating the image sensor 20. An annular groove 338 is formed between the protecting sheet 40 and a side surface 331 of the step portion 330. The second adhesive 339 can be black or a dark color to absorb stray light and prevents ghosting. The annular groove 338 receives overflowing adhesive when the adhesive is applied.

The lens module 50 is fixed on the supporting plate 31. The lens module 50 includes a lens barrel 52 and at least one lens 54 received in the lens barrel 52. An inner side surface 521 of the lens barrel 52 partially overlap with the outer side surface 361 of the flange barrier 36 in a vertical direction. The lens barrel 52 comprises a bottom surface 520 facing the protecting sheet 40. The bottom surface 520 includes a second positioning portion 522 matching with the first positioning portion 322. The second position portion 522 includes at least one groove.

Figure 4:
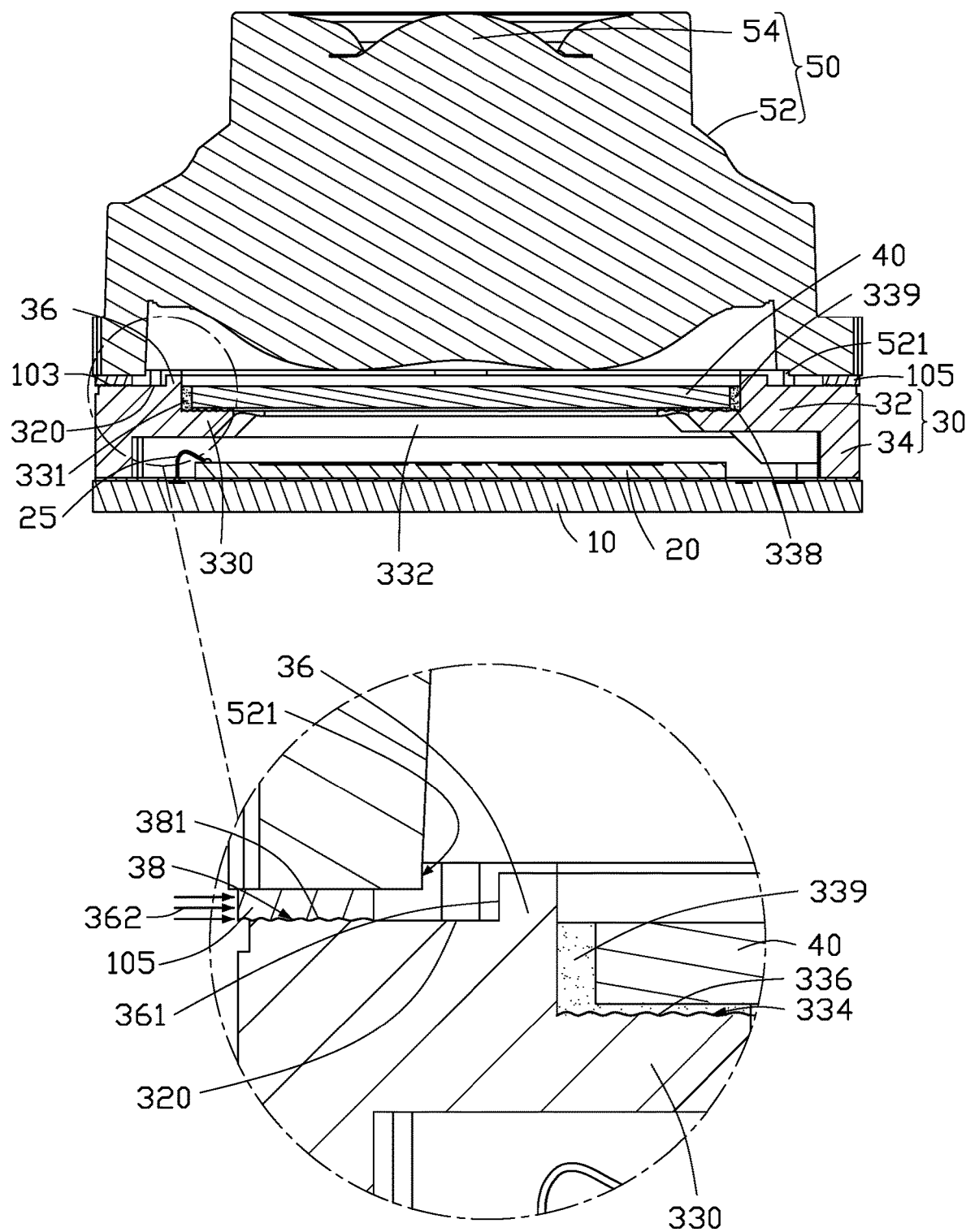
FIG. 4 is a cross-sectional view of the camera device in FIG. 1 alone the line III-III.

In the embodiment, the second position portion 522 includes four grooves formed at each corner of the bottom surface 520. The lens module 50 is fixed on the bonding area 38 of the supporting plate 31 by the layer of adhesive 105. An inner side surface 521 of the lens barrel 52 partially overlap with the outer side surface 361 of the flange barrier 36 in a vertical direction, as shown in FIG. 4, horizontal incident lights 362 can be blocked by the flange barrier 36 to avoid to form stray lights. The flange barrier 36 prevents light leaking between the lens module 50 and the supporting bracket 30.

The lens module 50 can be a fixed-focus camera module or a zoom camera module. A fixed-focus camera module does not allow focal length adjustment. A zoom camera module allows focal length adjustment, and an user can adjust focal length when using the camera module 100.

When the lens module 50 is fixed on the bonding area 38 of the supporting bracket 30, the first position portion 322 is inserted into the second position portion 522, and the flange barrier 36 blocks external light entering into the lens module 50 via the bonding location between the lens module 50 with the supporting bracket 30. The flange barrier 36 also prevents the adhesive 105 from overflowing onto the protecting sheet 40.

The top bearing surface 334 of the supporting bracket 30 includes a plurality of micro-structures 336. Incident light falling on the top bearing surface 334 may be diffused, thereby reducing the amount and the intensity of light which might be reflected onto the image sensor 20. Bright spots may also be avoided. Applying dark glue at an edge area of the protecting sheet 40 to absorb stray light may not be necessary when making a camera device 100 as disclosed.

The assembly processes may be simplified and a cost of the camera device 100 may be reduced. Since the top bearing surface 334 includes a plurality of micro-structures 336, when the second adhesive 339 is applied to fix the protecting sheet 40, an adhesive force of the second adhesive 339 with the top bearing surface 334 is increased, strengthening and stabilizing the protecting sheet 40. The second adhesive 339 in the annular groove 338 does not need to be solidified. The second adhesive 339 is configured to absorb debris or dust falling from the lens module 50.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A camera device comprising:
   a printed circuit board;
   an image sensor mounted on the printed circuit board;
   a supporting bracket fixed on the printed circuit board; and
   a lens module, wherein the supporting bracket comprises a supporting plate and a side wall perpendicular to the supporting plate, the supporting plate and the side wall together form a receiving room for covering the image sensor, the supporting plate comprises a supporting surface defining a light through hole in the central thereof, the supporting bracket further comprises a flange barrier protruding from the supporting surface, wherein the flange barrier surrounds the light through hole, the lens module is fixed on the supporting surface and surrounds the flange barrier, an inner side surface of the lens module partially overlap with the outer side surface of the flange barrier in a vertical direction; and wherein the supporting plate is opened to form a step portion, the step portion comprises a top bearing surface, the top bearing surface comprises a plurality of micro-structures; and
   a protecting sheet fixed on the top bearing surface, the protecting sheet is spaced away from a side surface of the step portion.

2. The camera device of claim 1, wherein the protecting sheet is fixed on the top bearing surface by a second adhesive, the protecting sheet and the side surface of the step portion together form an annular groove, the annular groove receives an overflow portion of the second adhesive when fixing the protecting sheet.

3. The camera device of claim 1, wherein:
   the protecting sheet is an infrared cut-off filter or a color filter.

4. The camera device of claim 2, wherein:
   the second adhesive is black or dark color.

5. The camera device of claim 1, wherein:
   the supporting bracket comprises a heat dissipating hole at the periphery of the supporting plate, the heat dissipating hole communicates with the receiving room.

6. The camera device of claim 1, wherein:
the supporting bracket further comprises a first positioning portion protruding from the supporting surface, the lens module comprises a lens barrel and at least one lens received in the lens barrel, and the lens barrel comprises a bottom surface, wherein the bottom surface comprises a second positioning portion matching with the first positioning portion.

7. The camera device of claim 6, wherein:
the first positioning portion comprises at least one bump, and the second position portion comprises at least one groove.

8. The camera device of claim 7, wherein:
a height of the first positioning portion is larger than a height of the flange barrier.

9. The camera device of claim 8, wherein:
the first positioning portion comprises four bumps, and the first positioning portion is formed at corners of the flange barrier.

10. The camera device of claim 1, wherein:
the supporting surface defines a bonding area surrounding the flange barrier, a layer of adhesive is formed on the bonding area, and the lens module is fixed on the supporting bracket by the layer of adhesive.

11. The camera device of claim 10, wherein:
the bonding area is formed with a plurality of microstructures.

12. The camera device of claim 1, wherein:
the printed circuit board is a rigid-flexible board and comprises a first portion and a second portion connected to the first portion, the image sensor and the supporting bracket are fixed on the first portion.

13. The camera device of claim 12, wherein:
the supporting bracket is fixed on the first portion via a first adhesive, the first adhesive comprises a first adhesive portion and a second adhesive portion, the first adhesive portion is applied on one circle of the printed circuit board and configured to fix a bottom of the supporting bracket, the second adhesive portion is applied on the second portion of the printed circuit board and configured to fix one side surface of the supporting bracket.

* * * * *